United States Patent
Cobanoglu et al.

(10) Patent No.: US 10,912,239 B2
(45) Date of Patent: Feb. 2, 2021

(54) SWITCHABLE ELECTROMAGNETIC SHIELD

(71) Applicant: Sanko Tekstil Isletmeleri San. Ve Tic. A.S., Inegol-Bursa (TR)

(72) Inventors: Özgür Cobanoglu, Inegol-Bursa (TR); Jitka Eryilmaz, Inegol-Bursa (TR); Ertug Erkus, Inegol-Bursa (TR); Fatih Donmez, Inegol-Bursa (TR); Fehim Caglar, Inegol-Bursa (TR)

(73) Assignee: Sanko Tekstil Isletmeleri San. Ve Tic. A.S., Inegol-Bursa (TR)

( * ) Notice: Subject to any disclaimer, the term of this patent is extended or adjusted under 35 U.S.C. 154(b) by 0 days.

(21) Appl. No.: 16/357,769

(22) Filed: Mar. 19, 2019

(65) Prior Publication Data

US 2019/0297756 A1    Sep. 26, 2019

(30) Foreign Application Priority Data

Mar. 20, 2018 (EP) ..................................... 18162715

(51) Int. Cl.
*H05K 9/00* (2006.01)
*H01Q 1/52* (2006.01)
(Continued)

(52) U.S. Cl.
CPC ........... *H05K 9/009* (2013.01); *D03D 1/0058* (2013.01); *H01Q 1/48* (2013.01); *H01Q 1/526* (2013.01);
(Continued)

(58) Field of Classification Search
CPC ..... H05K 9/009; D10B 2401/16; H01Q 1/526
See application file for complete search history.

(56) References Cited

U.S. PATENT DOCUMENTS 7,339,120 B2 * 3/2008 Notohara ............... H05K 9/009
                                                                174/357
7,830,672 B1   11/2010 Kitchen
(Continued)

FOREIGN PATENT DOCUMENTS

EP    1 890 527      2/2008
JP    2004349511    12/2004

OTHER PUBLICATIONS

European Search Report issued by the EPO dated Sep. 28, 2018 for priority application No. 18162715.09.
(Continued)

*Primary Examiner* — Hung V Ngo
(74) *Attorney, Agent, or Firm* — Silvia Salvadori

(57) ABSTRACT

It is disclosed an electromagnetic shield (1) and a related method for providing electromagnetic shielding wherein the shield comprises a shielding surface provided with a plurality of electrically conductive elements (2), said plurality of electrically conductive elements (2) being electrically connected to a switching assembly (3) configured to switch said electromagnetic shield (1) between an open configuration, wherein said electrically conductive elements (2) are electrically insulated from one another, and a shorted configuration wherein said electrically conductive elements (2) are electrically connected to each other at a common node (C). When the electrically conductive elements (2) of the electromagnetic shield (1) are switched between the open and shorted configurations, a change of the electromagnetic shielding effectiveness (EMSE) occurs. The electromagnetic shield (1) can be used for providing a shielding textile fabric (12), or an article that may comprise the electromagnetic shield (1) in form of a pocket preferably made with the shielding fabric (12).

19 Claims, 7 Drawing Sheets

(51) Int. Cl.
*D03D 1/00* (2006.01)
*H01Q 1/48* (2006.01)

(52) U.S. Cl.
CPC . *D03D 2700/0166* (2013.01); *D10B 2401/16* (2013.01)

(56) References Cited

U.S. PATENT DOCUMENTS

| | | | |
|---|---|---|---|
| 9,622,338 B2* | 4/2017 | Song | H01Q 15/0026 |
| 9,728,326 B2* | 8/2017 | Haynes | H05K 9/0064 |
| 2004/0263420 A1* | 12/2004 | Werner | H01Q 1/38 |
| | | | 343/909 |
| 2007/0159753 A1 | 7/2007 | Randall et al. | |
| 2015/0101860 A1* | 4/2015 | Lam | H05K 9/0086 |
| | | | 174/392 |
| 2017/0009387 A1* | 1/2017 | Ge | D03D 15/00 |
| 2017/0278585 A1* | 9/2017 | Almer | B32B 5/02 |
| 2018/0195210 A1* | 7/2018 | Sunshine | D02G 3/441 |

OTHER PUBLICATIONS

International Search Report issued by the EPO dated Jun. 4, 2019 for corresponding Intenational application No. PCT/EP2019/056678.

* cited by examiner

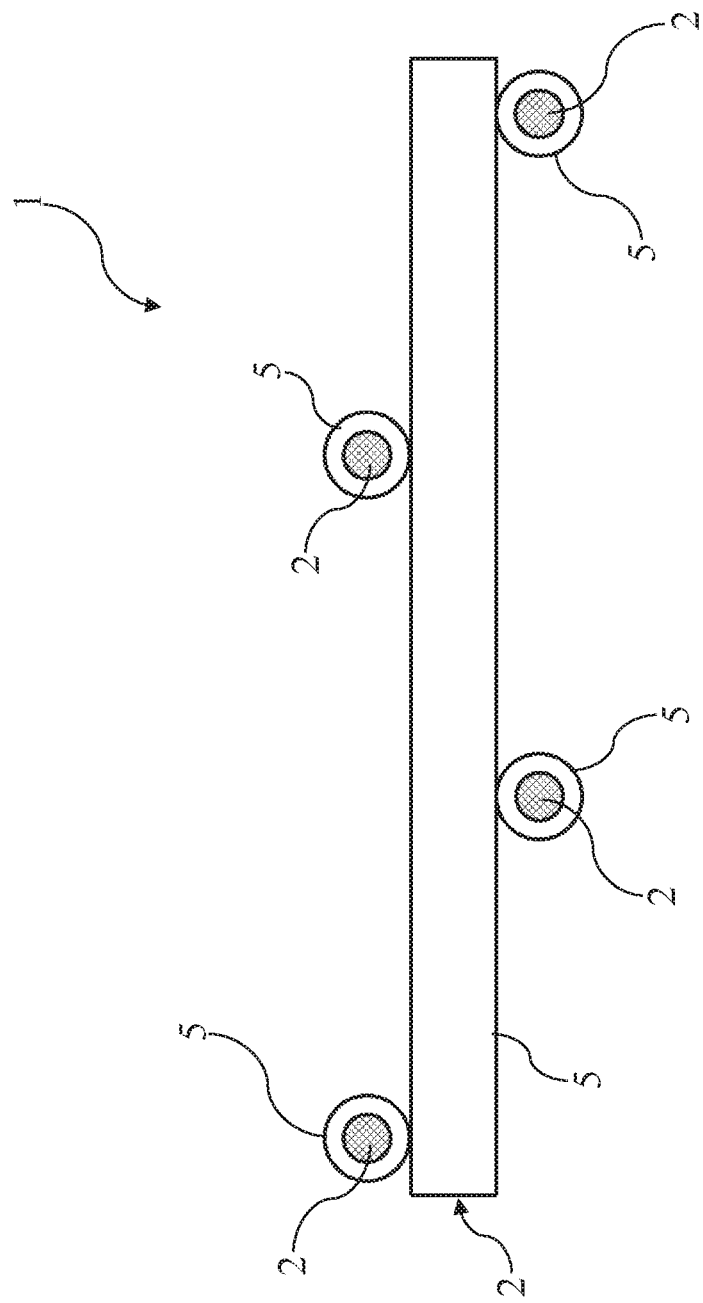

SWITCHABLE ELECTROMAGNETIC SHIELD

This application claims priority to and the benefit of European Application No. 18162715.9 filed on Mar. 20, 2018, the content of which is incorporated herein by reference in its entirety.

TECHNICAL FIELD

The present invention relates to the field of electromagnetic shields. In particular, the present invention relates to an electromagnetic shield having a switching capability between different shielding behaviors.

BACKGROUND

Electromagnetic shields are typically used for reducing the electromagnetic field in a space region by blocking the field with a barrier made of an electrically conductive material. Shields are typically applied to isolate electrical devices and electrical cables from the outside environment. Electromagnetic shielding that blocks radio frequency electromagnetic radiation is also known as RF shielding.

The most common electromagnetic shield is the Faraday cage that is a mesh of electrically conductive material arranged to surround a space region to be shielded. An electrically conductive enclosure formed by a continuous covering of such materials is also known as Faraday shield.

Normally, the mesh of a Faraday cage may be manufactured by forming openings to a continuous sheet of electrically conductive material (e.g. metal) or by soldering electrically conductive elements (e.g. rods or wires) between them so that an electrically conductive net is formed.

The presence of an electrical field, external to the Faraday cage, causes the electric charges within the cage's conducting material to be distributed such that they cancel the field's effect in the cage's interior. Such shielding effect depends upon the material used, its thickness, the size of the shielded volume and the frequency of the fields of interest and the size, shape and orientation of apertures in the mesh to the incident electromagnetic field.

Faraday cages may be used for example in the so called "Faraday bags" that are bags comprising a Faraday cage made of flexible metallic fabric. They are typically used to block remote wiping or alteration of wireless devices recovered in criminal investigations, but may also be used by the general public to protect against data theft or to enhance digital security (e.g. for avoiding unauthorized contactless payments). As a result, it is possible to isolate devices (e.g. smartphones, tablets, etc.) or contactless cards (credit/debits card, badges, etc.) from the "outside world".

However, Faraday bags can be uncomfortable for a daily use, for example whenever the user needs to use the device (e.g. to receive a phone call) or to use the contactless card (e.g. for a payment), the device or the card must be extracted from the Faraday bag.

In the light of this problem, US2014146510A1 discloses a protective device for electronically readable authentication card that can be switched between two shielding configuration. The protective device comprises an electrically conductive mesh sheath moveable between a first position (active shielding configuration) enclosing a card so as to provide shielding from electromagnetic radiation, and a second position (inactive shielding configuration) wherein the sheath is collapsed and the card is not shielded. This solution needs a rigid support to which the conductive mesh is coupled for allowing a reliable movement (switching) of the mesh between the extended and the collapsed configuration. The rigid support could be uncomfortable for the user, for example when the device to be shielded is adapted to be put in pocket (e.g. a smartphone). Furthermore, this solution appears to be very complex and expensive in case of a wide space region to be shielded (for example a room or a building).

SUMMARY OF THE INVENTION

An object of the present invention is to overcome the drawbacks of the prior art cited above and to provide an electromagnetic shield and a related method for providing electromagnetic shielding able be switched between different shielding behaviors in a simple and reliable manner.

A further object of the present invention is to provide an electromagnetic shield and a related method for providing electromagnetic shielding able to be easily assembled to an article such as a garment, a wallet, a purse, a bag, a card holder, or a phone cover in a reliable manner.

These and other objects are achieved by the present invention by means of an electromagnetic shield according to claim 1, by a shielding fabric according to claim 14, by an article according to claim 16, and by a method for providing electromagnetic shielding according to claim 20. Preferred aspects of the invention are recited in dependent claims.

In particular, according to the present invention, the electromagnetic shield comprises a shielding surface, i.e. a surface provided with a plurality of electrically conductive elements, wherein the plurality of electrically conductive elements are electrically connected to a switching assembly configured to switch at least part of the electrically conductive elements between an open configuration and a closed configuration.

In the open configuration, the electrically conductive elements are electrically insulated from one another. In other words, when the electrically conductive elements are in the open configuration, the switching assembly provides a very high resistance between the electrically conductive elements, so that no, or very little electric current (theoretically zero) will flow between the electrically conductive elements under the influence of an electric field.

In the shorted configuration, the electrically conductive elements are electrically connected to each other at a common node. In other words, when the electrically conductive elements are in the shorted configuration, the switching assembly provides a very low impedance between the electrically conductive elements, so that electric current is allowed to flow freely between the electrically conductive elements under the influence of an electric field.

This aspect advantageously enables to switch the electromagnetic shield between two shielding behaviors without the need of a relative movement of the electrically conductive elements with respect to the space region to be shielded. In particular, as will be described with more details later, by switching the electrically conductive elements between the open configuration and the shorted configuration, a change of the value of electromagnetic shielding effectiveness (EMSE) of the shielding surface occurs.

Preferably, the common node is electrically connected to a fixed ground potential. Alternatively or in addition, the common node is electrically connected to a dynamic driving potential for driving the plurality of electrically conductive elements as a transmitting antenna.

Advantageously, the dynamic driving potential is provided by a resonant circuit that preferably comprises a voltage controlled oscillator. This embodiment, allows to adjusting the value of electromagnetic shielding effectiveness (EMSE) by controlling the oscillation frequency of the dynamic driving potential.

A preferred embodiment provides that the switching assembly is further configured to electrically connect either the common node to the fixed ground potential, or the common node to the dynamic driving potential.

According to a particular aspect of the present invention, the electrically conductive elements comprise at least a first set of electrically conductive elements and at least a second set of electrically conductive elements. The switching assembly is further configured to switch at least part of the electrically conductive elements between a first partially shorted configuration and a second partially shorted configuration.

In the first partially shorted configuration, the electrically conductive elements of the first set are electrically connected to each other at the common node while the electrically conductive elements of the second set are electrically insulated from one another.

In the second partially shorted configuration, the electrically conductive elements of the second set are electrically connected to each other at a common node while the electrically conductive elements of the first set are electrically insulated from one another.

Advantageously, the electrically conductive elements are spaced one from another, in an embodiment, they are spaced by an electrically insulating material. Some embodiments provide that the electrically conductive elements are metal wires, preferably coated with an electrically insulating material (e.g. magnet wires). A magnet wire, also called "enameled wire" is a metal wire (for example made of copper or aluminum) coated with a very thin layer of insulation. Magnet wires are commercially available and are typically used in the construction of transformers, inductors, motors, speakers, hard disk head actuators, electromagnets, and other applications that require tight coils of insulated wire.

According to an aspect of the present invention, the electromagnetic shield comprises control means for controlling the switching of said switching assembly by a user. The control means may provide a user interface that can be for example a mechanical selector or a communication module, or in general means for receiving a configuration setting. In other word by means of the user interface of the control means, the user provides a configuration setting to the switching assembly that corresponds to the shielding configuration of the electrically conductive elements of the electromagnetic shield.

Preferably, the electrically conductive elements are arranged to form a mesh or a grid. According to an aspect of the present invention, the mesh or grid comprises a plurality of openings each having an extension of less than 400 mm$^2$, preferably comprised between 1 mm$^2$ and 100 mm$^2$.

A particular embodiment of the present invention provides that the electrically conductive elements are metal wires arranged to form at least a part of the warp and/or of the weft of a fabric. Preferably, the metal wires are magnet wires coated with textile fibers, such as e.g. cotton fibers (e.g. staple cotton fibers). The insulated metal wires may form part of the warp yarns and/or of the weft yarns in a woven fabric.

A further object of the present invention is a shielding fabric, i.e. a fabric comprising a plurality of insulated electrically conductive wires; suitable wires are wires made of an electrically conductive material (e.g. metal) and sheathed with an electrically insulating material (preferably magnet wires) arranged to form at least a part of the warp and/or of the weft of the fabric. The insulated electrically conductive wires are configured to be electrically connected to a switching assembly for providing an electromagnetic shield according to an embodiment of the present invention. According to an aspect of the present invention, the shielding fabric is a denim fabric. A further object of the present invention is an article comprising an electromagnetic shield according to the above discussed embodiments of the present invention. For example, the article may be a garment, a wallet, a purse, a bag, a card holder, or a phone cover. Preferably, the article comprises a shielding fabric according to the present invention, more preferably the article is provided with at least a pocket made of the above mentioned shielding fabric.

A further object of the present invention is a method for providing electromagnetic shielding from an electromagnetic field comprising the following steps:
(a) providing an electromagnetic shield according to an embodiment of the present invention;
(b) switching at least part of the electrically conductive elements of the electromagnetic shield between the open configuration and the shorted configuration.

The step (b) causes a change of the electromagnetic shielding effectiveness (EMSE) of the shielding surface at one or more frequencies of the electromagnetic field.

As a result, the electromagnetic shield of the present invention can be switched between different shielding behaviors having different EMSE values at one or more frequencies of the electromagnetic field. In other words, the basic idea is to have a grid or pile of isolated conductors at the beginning and short circuiting them to create a cage of conductors for altering the shielding behavior of the grid of conductors. This switch can be implemented for any geometry, grouping of conductors, etc.

BRIEF DESCRIPTION OF THE DRAWINGS

The invention will now be described in greater detail, by way of example, with reference to the accompanying non limiting drawings. It is emphasized that, according to common practice, the various features of the drawing are not necessarily to scale. On the contrary, the dimensions of the various features are arbitrarily expanded or reduced for clarity. Like numerals denote like features throughout the specification and the drawings in which:

FIG. 2 is a cross section along the cutting plane A-A of the electromagnetic shield shown in FIG. 1;

DETAILED DESCRIPTION

Figure 1:
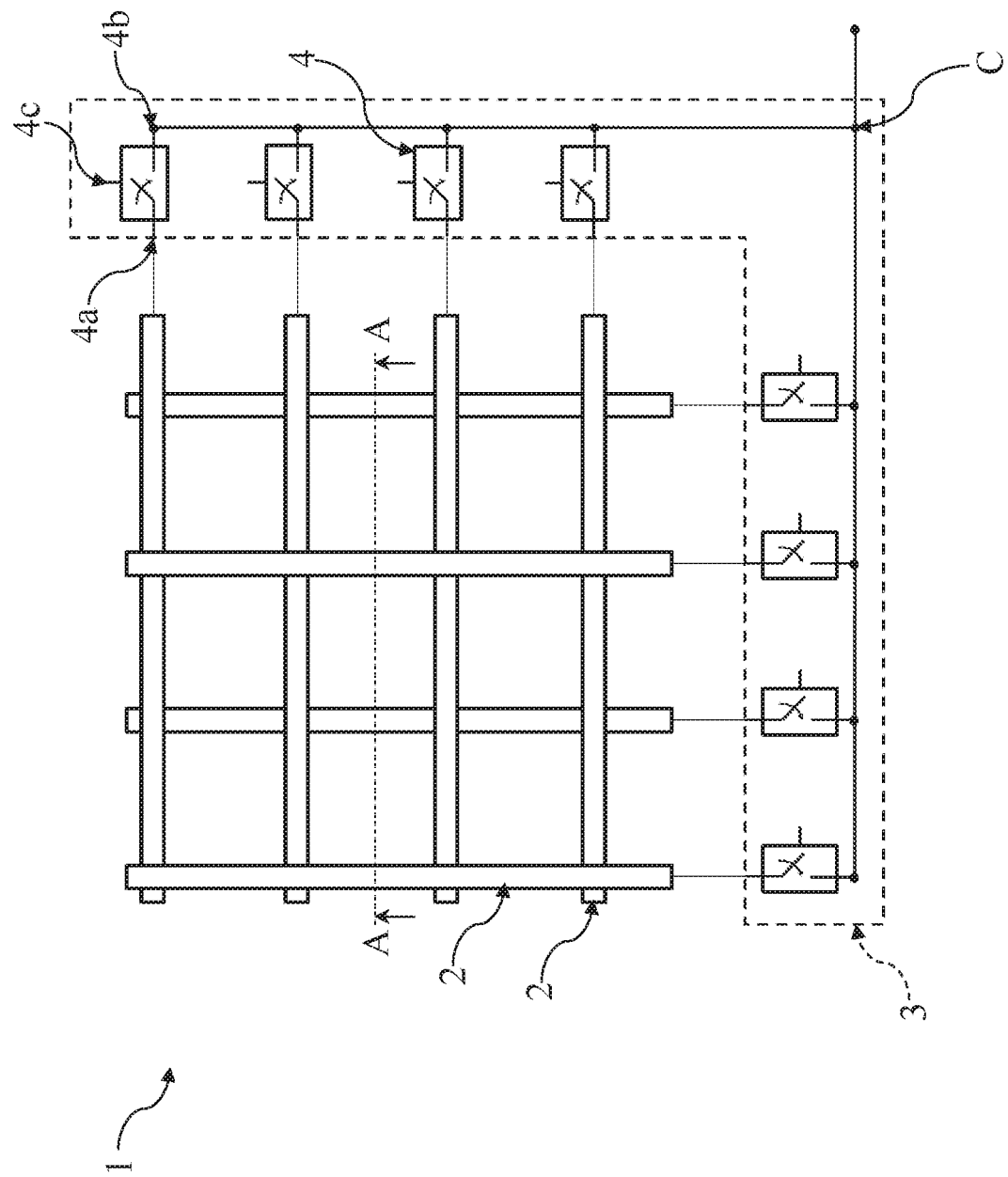
FIG. 1 schematically shows a perspective view of an electromagnetic shield according to an embodiment of the present invention.

FIG. 1 shows an exemplary embodiment of an electromagnetic shield 1 according to the present invention. The electromagnetic shield 1 comprises a plurality of electrically conductive elements 2 arranged for defining a shielding surface. The shielding surface can be defined as the surface that substantially separates the shielded space region from the outside space region with respect to an incident electromagnetic field.

The electrically conductive elements 2 have a substantially linear shape, i.e. each conductive element 2 extends mainly along a linear direction (along a main dimension, with the other two negligible). For example, the electrically conductive elements 2 may be in form of rods, wires or similar elements having an elongated shape.

Preferably, the conductive elements 2 can be arranged to form a mesh, a net or a grid as shown for example schematically in FIG. 1. However, further embodiments (not shown) may provide that all the electrically conductive elements 2 of the shielding surface are arranged substantially parallel to each other still remaining in the scope of protection of the present invention.

With respect to FIG. 1, the electrically conductive elements 2 are electrically connected to a switching assembly 3 (shown in dotted line) configured to switch the electrically conductive elements 2 between an open configuration and a closed configuration.

In particular, the switching assembly 3 comprises a plurality of switching elements 4 that may be preferably of the type electrically operated, such as relays, transmission gates or similar switching elements known per se in the art. However, further embodiments can provide that switching elements 4 comprise mechanically operated switches.

Each electrically conductive element 2 is electrically connected to a first terminal 4a of a correspondent switching element 4 of the switching assembly 3. The second terminals 4b of the switching elements 4 are electrically connected to a common node C.

The switching elements 4 comprise a control terminal 4c for controlling the opening and the closing of the switching element 4 between the terminals 4a, 4b. In the case of mechanically operated switching elements 4, the control terminal 4c may be a lever or a selector moveable between a closed and open position. In case of electrically operated switching elements 4, the control terminal 4c may be an electrical terminal configured to receive a control signal (e.g. a voltage) having a Boolean value representing the open status and the closed status of the switching element 4.

When the switching elements 4 are open, the electrically conductive elements 2 are electrically insulated from one another (open configuration). When the switching elements 4 are closed, the electrically conductive elements 2 are electrically connected to each other at the common node C (shorted configuration).

The switching assembly 3 is electrically connected to one of the ends of the conductive elements 2, so that when the electrically conductive elements 2 are in the shorted configuration, the electrically conductive elements 2 are electrically connected to each other at one of their ends. Further embodiments can provide that each end of the electrically conductive elements 2 is electrically connected to a switching element 4, so that when the electrically conductive elements are in the shorted configuration, both the ends of each electrically conductive element 2 are electrically connected to the common node C.

As will be later shown with more details, by switching the electrically conductive elements 2 of the electromagnetic shield 1 between the open configuration and the shorted configuration, a change of the value of electromagnetic shielding effectiveness (EMSE) of the shielding surface occurs.

In particular, the electromagnetic shielding effectiveness is a function of the frequency values of the electromagnetic field incident to the shielding surface of the electromagnetic shield. The values of the electromagnetic shielding effectiveness, at one or more frequency values, change when the electrically conductive elements 2 of the electromagnetic shield 1 are switched between the open and the shorted configuration.

In other words, the present invention provides an electromagnetic shield 1 having an electromagnetic shielding effectiveness value, for example at a predetermined frequency, that can be changed by controlling switching assembly 3.

In particular, by arranging the electrically conductive elements 2 in a proper manner, a shielding surface having an electromagnetic shielding effectiveness value switchable between two different values can be obtained. For example, for shielding electromagnetic fields in the range of frequency comprised in the radiofrequency (RF), electrically conductive elements 2 may be arranged to form a mesh or a grid provided with openings having extension less than 400 $mm^2$. Preferably, the extension of these openings may be comprised between 1 $mm^2$ and 100 $mm^2$, more preferably about 10 $mm^2$.

For example, some embodiments can provide that the electromagnetic shield 1 is designed for a predetermined frequency of the electromagnetic field to be shielded so that a high value of EMSE is provided by the shielding surface when the electrically conductive elements 2 are in the closed configuration, while a low value of EMSE is provided by the shielding surface when the electrically conductive elements 2 are in the open configuration.

With respect to FIG. 2, the electrically conductive elements 2 are spaced one from another by an electrically insulating material 5. Preferably, the electrically conductive elements 2 are sheathed by a dielectric layer 5 (e.g. insulated wires). For example, the electrically conductive elements 2 may be copper wires, or metal rods sheathed with a dielectric layer 5.

Figure 3A:
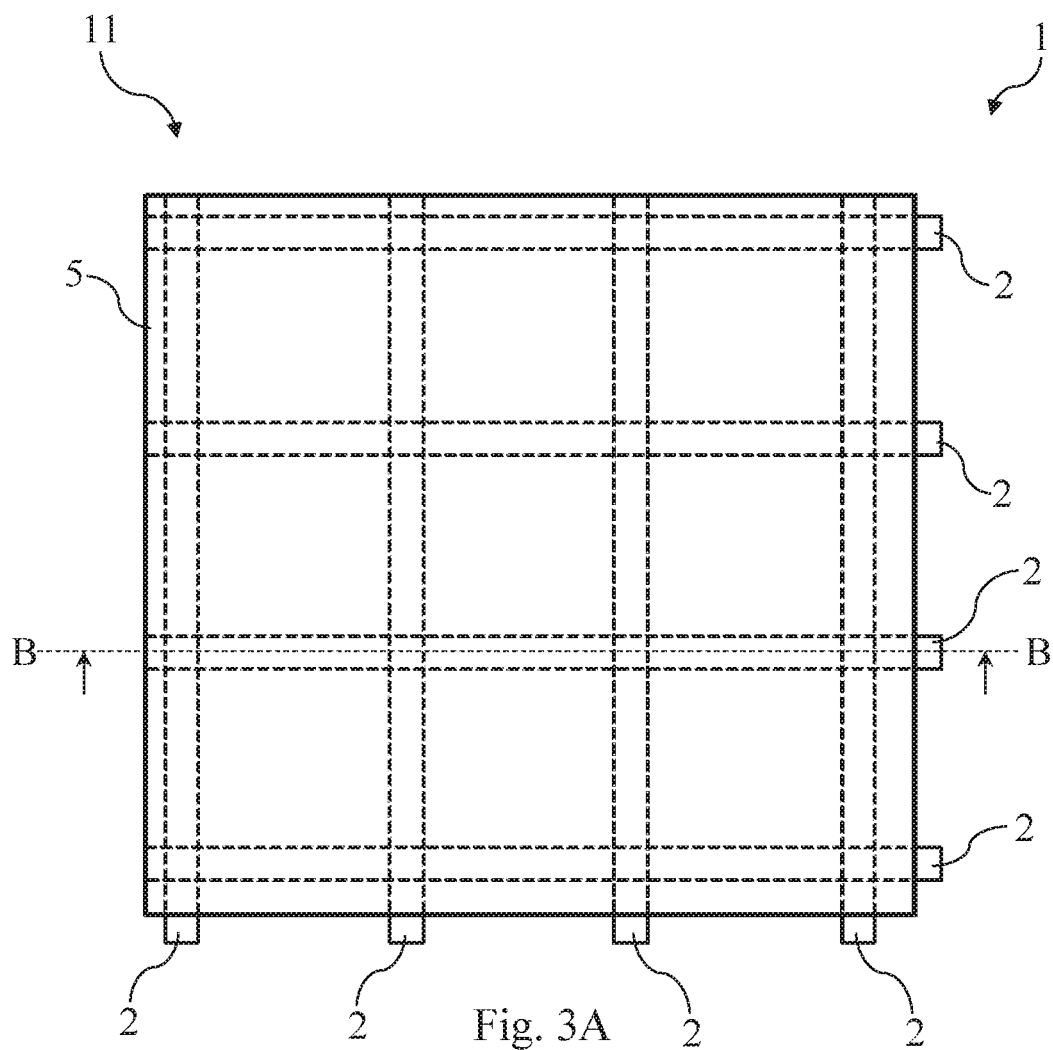
FIG. 3A schematically shows a perspective view of an electromagnetic shield according to a further embodiment of the present invention.
Figure 3B:
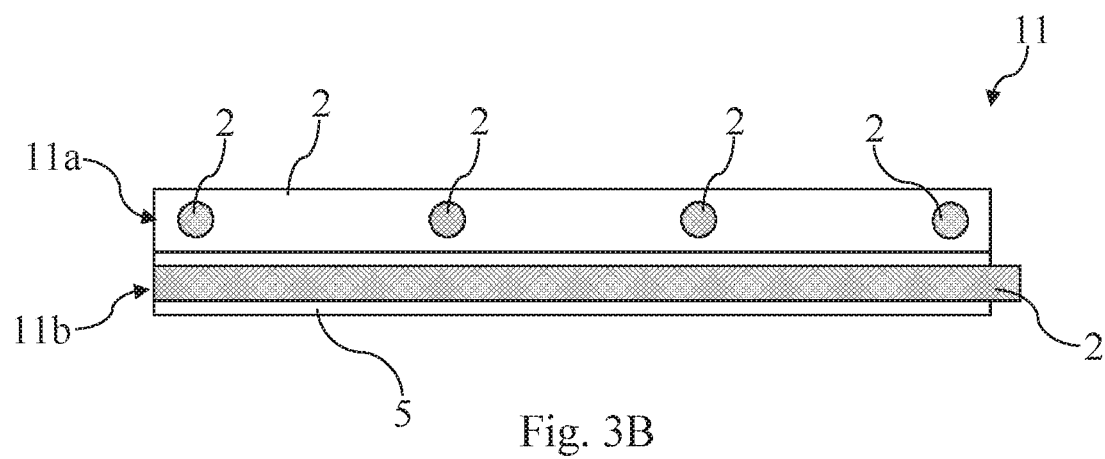
FIG. 3B is a cross section along the cutting plane B-B of the electromagnetic shield shown in FIG. 3A.

In some embodiments (shown schematically in FIGS. 3A and 3B) the electrically conductive elements 2 may be embedded in one or more layers of electrically insulating material 5 forming a sheet 11a, 11b. A plurality of said sheets 11a, 11b can be overlapped and coupled together to form a shielding panel 11. These embodiments can be very useful when the spatial region to be shielded is for example a room or a building.

Advantageously, the electrically conductive elements 2 of each panel 11 may be provided with a first end having a connection terminal in form of a socket, the other end of the electrically conductive elements 2 may be provided with a connection terminal in form of a plug for carrying out a quick and simple electrical connection between a plurality of panels 11.

Figure 4:
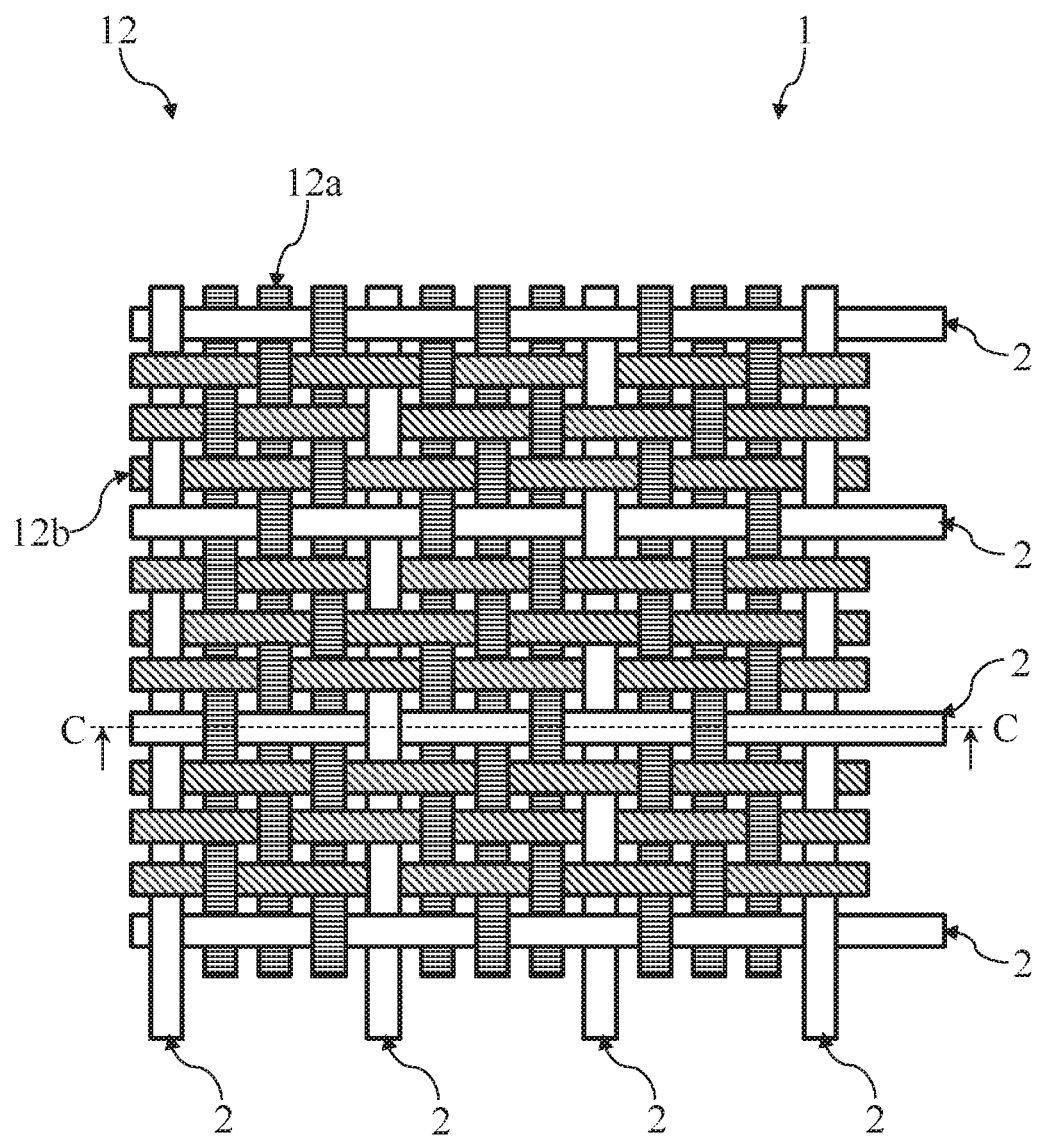
FIG. 4 schematically shows a perspective view of a shielding fabric according to an embodiment of the present invention.
Figure 5:
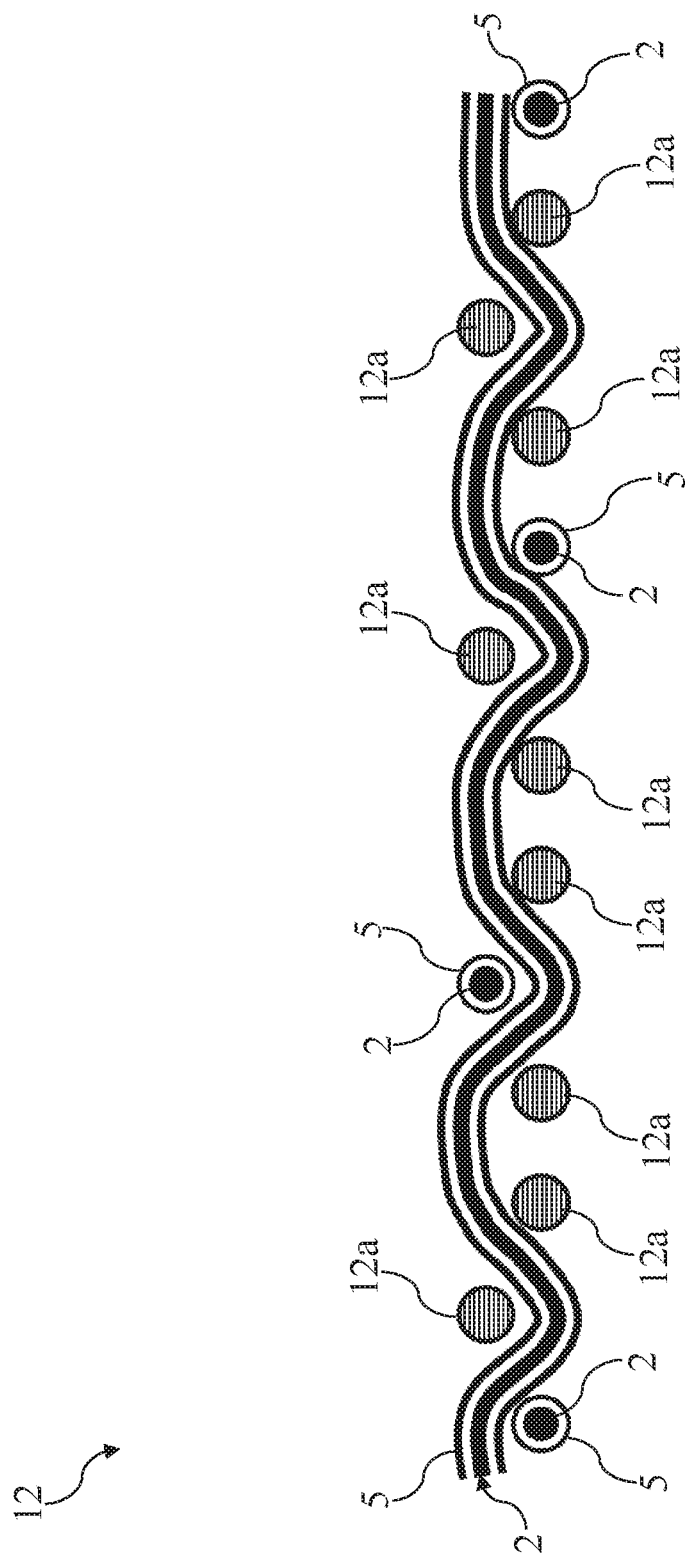
FIG. 5 is a cross section along the cutting plane C-C of the shielding fabric shown in FIG. 4.

With respect to FIGS. 4 and 5, the electrically conductive elements 2 may be metal wires (e.g. copper wires), preferably magnet wires (or in general electrically conductive wires sheathed with an electrically insulating material). In this embodiment, electrically conductive elements 2 are arranged to form a part of the warp 12a and of the weft 12b of a fabric 12 that is preferably a denim fabric.

Some embodiments may provide that the electrically conductive elements 2 are arranged to form only a part of the warp 12a or only a part of the weft 12b of the fabric 12. Other embodiments may provide that the electrically conductive elements 2 are arranged to form the totality of the warp 12a and/or the totality of the weft 12b still remaining in the scope of protection of the present invention. In general the shielding fabric 12 comprises a plurality of electrically conductive elements 2 arrange to form at least a part of the warp 12a and/or of the weft 12b of the fabric 12.

For example, the embodiment shown in FIG. 4 and in FIG. 5 provides that a quarter of the warp yarns 12a of the fabric 12 comprises conductive elements 2. The electrically conductive elements 2 are preferably arranged so that between two consecutive electrically conductive elements 2 of the warp, three regular warp yarns 12a are present.

The weft 12b of the fabric 12 may be formed, in the same manner, as disclosed as for the warp. As a result electrically conductive elements 2 form a grid having substantially square openings, woven with regular yarns 12a, 12b.

Figure 6:
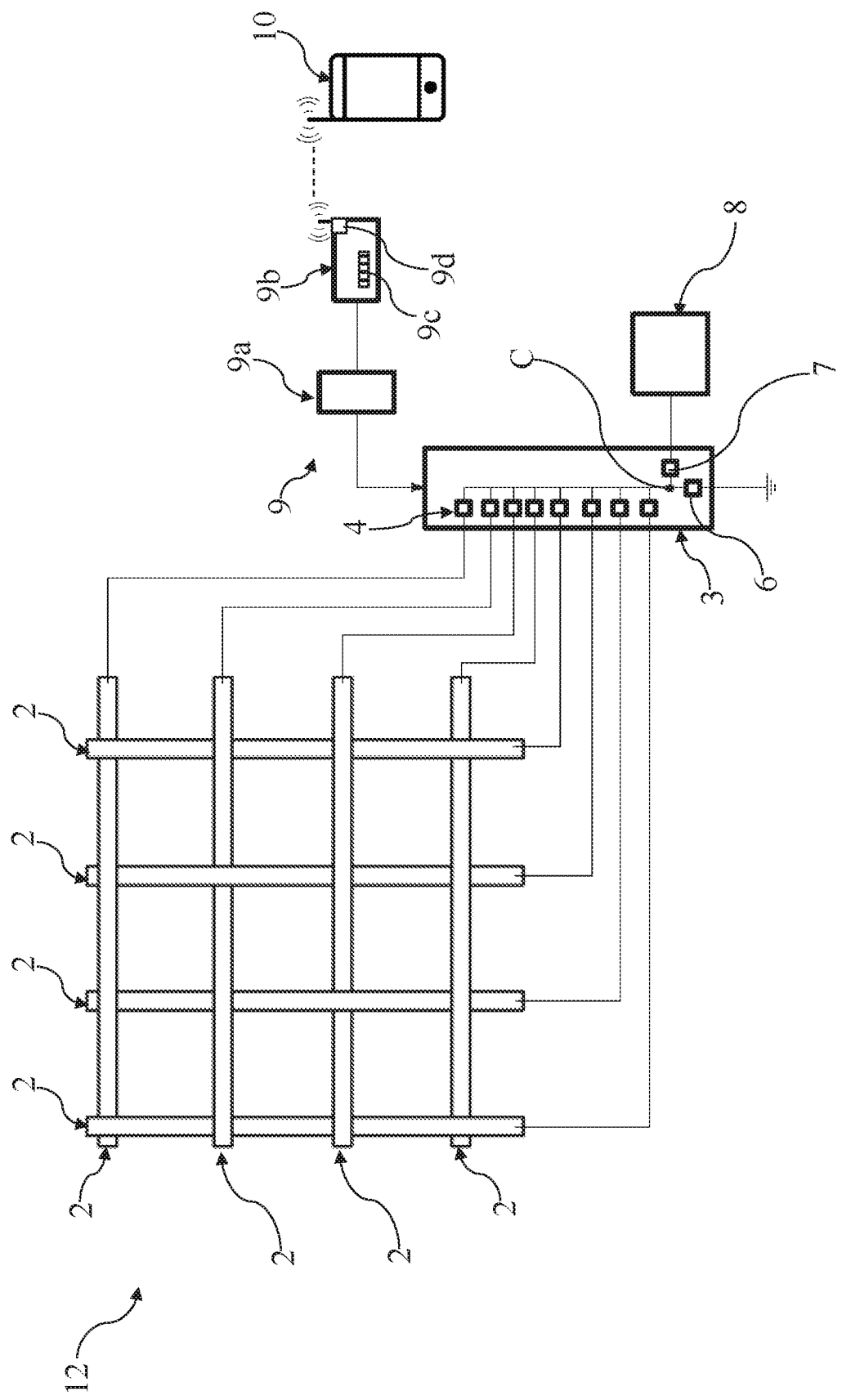
FIG. 6 schematically shows a perspective view of an electromagnetic shield according to an embodiment of the present invention.

A preferred embodiment may provide for example that the electrically conductive elements 2 are core-spun cotton yarns having a core comprising a copper magnet wire. Referring to FIG. 6, the electromagnetic shield 1 may comprise a switching assembly 3 provided with two further switching elements 6 and 7. The switching element 6 is configured to electrically connect the common node C to a fixed ground potential, the switching element 7 is configured to electrically connect the common node C to a resonant circuit 8.

The resonant circuit 8 is configured to provide a dynamic driving potential for driving the electrically conductive elements 2 as a transmitting antenna when the electrically conductive elements of the electromagnetic shield 1 are in the shorted configuration and the common node C is electrically connected to the resonant circuit 8.

The Applicant has been noted that by applying a dynamic driving potential (e.g. a sinusoidal voltage signal) having a determined oscillation frequency to the common node C, the EMSE value provided by the electromagnetic shield 1 changes with respect to EMSE value provided when the common node C is electrically connected to a fixed ground potential.

In a preferred embodiment, the resonant circuit 8 comprises a voltage controlled oscillator (VCO) for controlling the oscillation frequency of the dynamic driving potential. As a result, the EMSE provided by the electromagnetic shield when the electrically conductive elements in shorted configuration can be adjusted while the common node C is electrically connected to the resonant circuit 8.

With respect to FIG. 6, the switching elements 6 and 7 are controlled to electrically connect either the common node C to the fixed ground potential or the common node C to the resonant circuit 8. In other words, when the switching element 6 is closed then the switching element 7 is open so that the common node C is at the fixed ground potential. Analogously, when the switching element 6 is open then the switching element 7 is closed so that the common node C is at a dynamic driving potential provided by the resonant circuit 8. For example, if the switching elements 6, 7 are electrically operated (such as transmission gates, or relays), the control signal of the switching element 6 is the not logic with respect to the control signal of the switching element 7 or vice versa.

However, some embodiments may provide that either the common node C is electrically connected only to the fixed ground potential or that the common node C is electrically connected only to the resonant circuit 8, still remaining within the scope of protection of the present invention. In other words, the switching assembly 3 of these embodiments is not provided with the switching element 6 and 7 and the common node C is directly connected to the ground potential or to the resonant circuit 8.

The electromagnetic shield 1 comprises control means 9 for controlling the switching of the switching assembly 3 by a user. For example, the control terminals 4c of the switching elements 4 can be advantageously connected to logic circuit 9a configured for controlling the opening and the closing of the switching element 4.

The logic circuit 9a may be controlled by a user interface 9b that can comprise a selector 9c for example a mechanical selector 9c configured to select a shielding configuration of the electrically conductive elements 2 between the open configuration and the shorted configuration.

If the electromagnetic shield is further provided of a resonant circuit 8, the user interface 9b may be further configured to select (for example by means of the selector 9c) a shielding configuration chosen between: the open configuration, the shorted configuration with common node at a fixed ground potential, and the shorted configuration with the common node C at a dynamic driving potential.

A preferred embodiment may provide that the user interface 9b comprises a communication module 9d, preferably a wireless communication module (e.g. a Bluetooth module) configured to receiving a configuration signal from an external device 10 (for example a smartphone, a PC, or a similar device).

The configuration signal can be selected by means of the external device 10, for example by a graphic interface provided in the external device 10. In a preferred embodiment, the switching assembly 3 is configured for allowing the control of the opening and the closing for each switching element 4, so that the electrically conductive elements 2 of the electromagnetic shield 1 can be switched between a first partially shorted configuration and a second partially shorted configuration.

When the electrically conductive elements are in the first partially shorted configuration, a first set of the electrically conductive elements 2 are electrically connected to each other at the common node C while a second set of the electrically conductive elements 2 are electrically insulated from one another. Analogously when the alactrically conductive elements are in the second partially shorted configuration, the electrically conductive elements 2 of the second set are electrically connected to each other at the common node C while the electrically conductive elements 2 of the first set are electrically insulated from one another.

The Applicant has been noted that the EMSE changes by switching the electrically conductive elements 2 of the electromagnetic shield 1 between a partial shorted configuration (the first or the second) and the open or shorted configuration.

For example, by means of the external device 10, the user may select the electrically conductive elements 2 of the first and of the second set for defining the two aforementioned partially shorted configurations. As a result, the EMSE can be adjusted by the user by switching the electrically conductive elements of the electromagnetic shield between various partially shorted configuration. Furthermore, the common node C of the electrically conductive elements 2, in a partially shorted configuration, may be electrically connected to the fixed ground potential or to a dynamic driving potential (having preferably an adjustable oscillation frequency).

In this way, the same electromagnetic shield 1 can be adjusted, for a determined frequency of the electromagnetic field to shield, for providing an EMSE within a desired range of values. In other words the electromagnetic shield can provide a shielding surface having an EMSE switchable between a first value and a second value comprised in a desired first range and second range respectively.

Summarizing, a method for providing electromagnetic shielding from an electromagnetic field comprises the following steps:

(a) providing an electromagnetic shield according to any one embodiment of the present invention;
(b) switching the electrically conductive elements 2 of the electromagnetic shield between the open configuration and the shorted configuration.

The step (b) causes a change of the electromagnetic shielding effectiveness (EMSE) of the shielding surface at one or more predetermined frequencies of the electromagnetic field.

Preferably, the method may comprise a further step (c) of adjusting the electromagnetic shielding effectiveness of the shielding surface.

Some embodiments may provide that the step (c) is carried out for example by selecting a part of the electrically conductive elements 2 (for example the first or second set of electrically conductive elements 2) to be electrically connected to the common node (C) when the electrically conductive elements are in a partially shorted configuration (for example in the first or second partially shorted configuration).

Some embodiment may provide that the step (c) is carried out for example by adjusting the oscillation frequency of the dynamic driving potential provided by a resonant circuit electrically connected to the common node (C). In this embodiment, the step (c) may be carried out when the electrically conductive elements are in the shorted configuration or in a partially shorted configuration.

Figure 7:
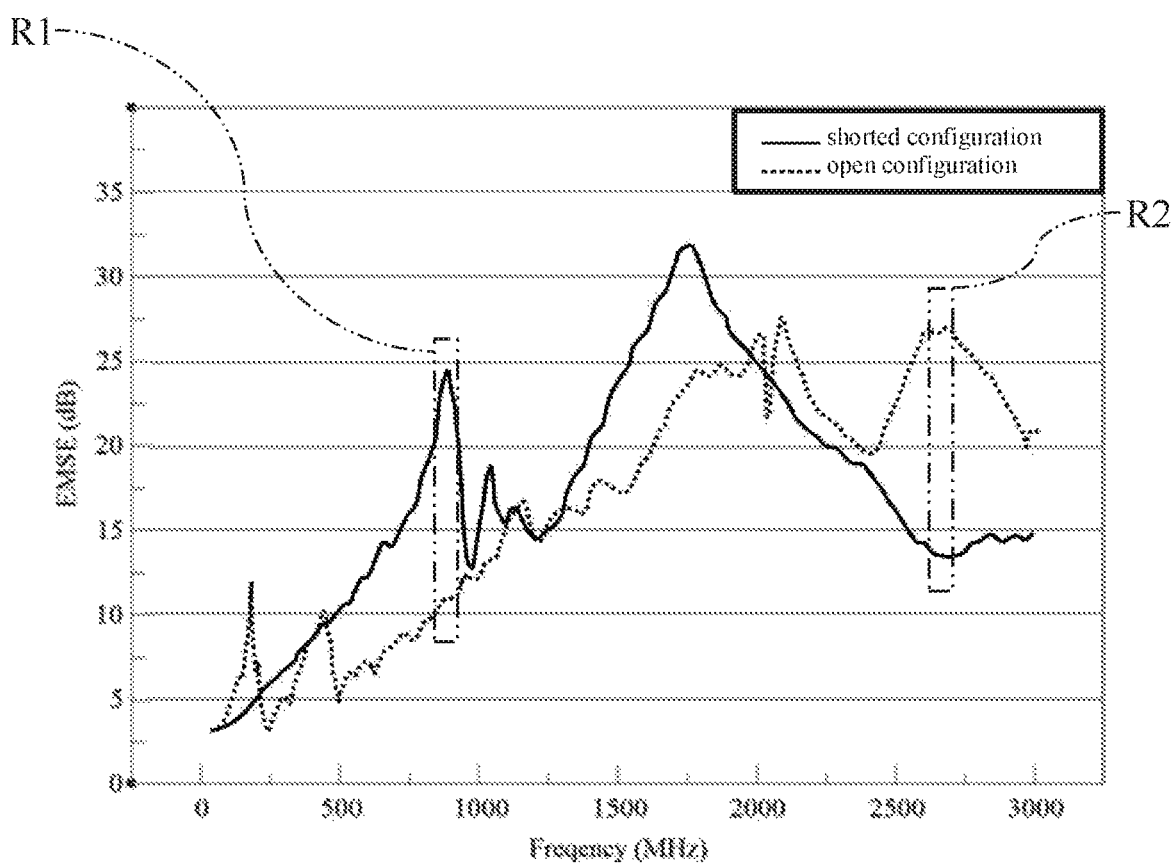
FIG. 7 shows a graph of the EMSE in the frequency domain of an embodiment of the electromagnetic shield of the present invention in two shielding configuration (shorted configuration in filled line and open configuration in dotted line).

FIG. 7 shows a graph of the EMSE in the frequency domain when the electrically conductive elements 2 of the electromagnetic shield 1 are in the shorted configuration (filled line) and in the open configuration (dotted line).

In particular, the graph shown in FIG. 7 is based on a measurement of the EMSE carried out according to the ASTM D 4935-10 on a sample of a shielding textile fabric 12, wherein the electrically conductive elements comprise core-spun cotton yarns with a core made of copper magnet wires having section diameter of about 35 µm. The electrically conductive elements 2 are woven with other yarns made of cotton and form a grid provided with openings having substantially a square shape with side of about 3 mm.

As can be noted from the graph, by switching the electrically conductive elements of the electromagnetic shield between the shorted and the open configuration, the values of EMSE can change considerably. For example, at a first range (schematically indicated with a rectangle R1) of frequencies comprised between about 800 MHz and 900 MHz the difference between the values of EMSE provided by the electromagnetic shield with electrically conductive elements in shorted configuration and in open configuration is comprised between about 10 dB and 15 dB.

With respect to the FIG. 7, at a second range (schematically indicated with a rectangle R2) of frequencies comprised between about 2.6 GHz and 2.7 GHz the difference between the values of EMSE provided by the electromagnetic shield with electrically conductive elements in shorted configuration and in open configuration is comprised between about 10 dB and 12 dB.

The electromagnetic shield 1 can be easily assembled to an article such as a garment, a wallet, a purse, a bag, a card holder, or a phone cover. By switching the electrically conductive elements of the electromagnetic shield 1 between the open configuration and the shorted configuration, the EMSE of the shielding surface can be switched for example between a first value that allows the passage of RF signals through the shielding surface and a second value wherein RF waves are shielded.

Some embodiments may provide that the electromagnetic shield 1 is coupled to a pocket, for example made of the shielding fabric 12 of the present invention. The pocket can be assembled to a garment (for example a pair of pants), or to a pursue, or to a wallet. The pocket may be used for example to directly or indirectly housing a contact-less credit/debit card in its interior. By means of the user interface 9b (mechanically selector and/or wireless communication module) the user can provide a configuration setting to the switching assembly 3 so that the electrically conductive elements of the electromagnetic shield 1 can be switched between different shielding configurations (for example between the shorted and the open configuration). The electromagnetic shield 1 can be designed for providing different values of EMSE at the frequency used for carrying out contact less payment by the credit/debit card.

Thanks to this embodiment, the user may select a configuration setting providing a shielding configuration with a high value of EMSE when the credit card is in the pocket and the user desirers to prevent a unauthorized payment. When the user desirers to use the credit card in contact-less mode, the electromagnetic shield can be switched by the user by selecting a configuration setting that provides a shielding configuration with a low value of EMSE.

The invention claimed is:

1. An electromagnetic shield (1) comprising a shielding surface provided with a plurality of electrically conductive elements (2), wherein said plurality of electrically conductive elements (2) are electrically connected to a switching assembly (3) configured to switch at least part of said electrically conductive elements of said electromagnetic shield (1) between an open configuration, wherein said electrically conductive elements (2) are electrically insulated from one another, and a shorted configuration wherein said electrically conductive elements (2) are electrically connected to each other at a common node (C) wherein said electrically conductive elements are core-spun cotton yarns having a core comprising a metal wire coated with an electrical insulating material and are arranged to form at least a part of the warp and/or the weft of a fabric.

2. The electromagnetic shield (1) according to claim 1, wherein said common node (C) is electrically connected to a fixed ground potential.

3. The electromagnetic shield (1) according to claim 1, wherein said common node (C) is electrically connected to a dynamic driving potential for driving said plurality of electrically conductive elements (2) as a transmitting antenna.

4. The electromagnetic shield (1) according to claim 3, wherein said switching assembly (3) is further configured to electrically connect either said common node (C) to a fixed ground potential or said common node to said dynamic driving potential.

5. The electromagnetic shield (1) according to claim 3, wherein said dynamic driving potential is provided by a resonant circuit (8).

6. The electromagnetic shield (1) according to claim 5, wherein said resonant circuit (8) comprises a voltage controlled oscillator.

7. The electromagnetic shield (1) according to claim 1, wherein said electrically conductive elements (2) are spaced one from another by an electrically insulating material (5).

8. The electromagnetic shield (1) according to claim 1, wherein said plurality of electrically conductive elements (2) comprises a first set of electrically conductive elements (2) and a second set of electrically conductive elements (2), said switching assembly (3) being further configured to switch said at least part of electrically conductive elements of the electromagnetic shield (1) between a first partially shorted configuration, wherein the electrically conductive elements (2) of said first set are electrically connected to each other at said common node (C) and the electrically conductive elements (2) of said second set are electrically insulated from one another, and a second partially shorted configuration, wherein the electrically conductive elements (2) of said second set are electrically connected to each other at said common node (C) and said electrically conductive elements (2) of said first set are electrically insulated from one another.

9. The electromagnetic shield (1) according to claim 1, comprising control means (9) for controlling the switching of said switching assembly (3) by a user.

10. The electromagnetic shield (1) according to claim 1, wherein said plurality of electrically conductive elements (2) are arranged to form a mesh or a grid.

11. The electromagnetic shield (1) according to claim 10, wherein said mesh or grid comprises a plurality of openings having extension less than 400 mm$^2$.

12. The electromagnetic shield (1) according to claim 11, wherein said mesh or grid comprises a plurality of openings having extension comprised between 1 mm$^2$ and 100 mm$^2$.

13. A shielding fabric (12) comprising a plurality of insulated electrically conductive wires (2) arranged to form at least a part of the warp (12*a*) and/or of the weft (12*b*) of said shielding fabric (12), said wires (2) being configured to be electrically connected to a switching assembly (3) for providing an electromagnetic shield (1) according to claim 1.

14. The shielding fabric (12) according to claim 13, wherein said fabric (12) is a denim fabric.

15. An article comprising an electromagnetic shield (1) according to claim 1.

16. The article according to claim 15, wherein said article comprises a shielding fabric (12) comprising a plurality of insulated electrically conductive wires (2) arranged to form at least a part of the warp (12*a*) and/or of the weft (12*b*) of said shielding fabric (12), said wires (2) being configured to be electrically connected to a switching assembly (3) for providing an electromagnetic shield (1) comprising a shielding surface provided with a plurality of electrically conductive elements (2), wherein said plurality of electrically conductive elements (2) are electrically connected to a switching assembly (3) configured to switch at least part of said electrically conductive elements of said electromagnetic shield (1) between an open configuration, wherein said electrically conductive elements (2) are electrically insulated from one another, and a shorted configuration wherein said electrically conductive elements (2) are electrically connected to each other at a common node (C).

17. A method for providing electromagnetic shielding from an electromagnetic field comprising the following steps:
a) providing an electromagnetic shield (1) according to claim 1;
b) switching at least part of said electrically conductive elements of said electromagnetic shield (1) between said open configuration and said shorted configuration.

18. The method according to claim 17, wherein said step (b) causes a change of the electromagnetic shielding effectiveness (EMSE) of said shielding surface at one or more frequencies of said electromagnetic field.

19. An electromagnetic shield comprising a shielding surface provided with a plurality of electrically conductive elements, wherein said plurality of electrically conductive elements are electrically connected to a switching assembly configured to switch at least part of said electrically conductive elements of said electromagnetic shield between an open configuration, wherein said electrically conductive elements are electrically insulated from one another, and a shorted configuration wherein said electrically conductive elements are electrically connected to each other at a common node and wherein said electrically conductive elements are core-spun cotton yarns having a core comprising a metal wire coated with an electrical insulating material and are arranged to form at least a part of the warp and/or of the weft of a fabric.

* * * * *